United States Patent [19]
Vinal

[11] Patent Number: 4,689,648
[45] Date of Patent: Aug. 25, 1987

[54] MAGNETICALLY SENSITIVE METAL SEMICONDUCTOR DEVICES

[75] Inventor: Albert W. Vinal, Cary, N.C.

[73] Assignee: International Business Machines Corporation, Armonk, N.Y.

[21] Appl. No.: 868,900

[22] Filed: May 27, 1986

Related U.S. Application Data

[63] Continuation of Ser. No. 499,101, May 27, 1983, abandoned.

[51] Int. Cl.$^4$ .............................................. H01L 27/22
[52] U.S. Cl. ........................................ 357/27; 357/15; 307/309
[58] Field of Search ............................ 357/27, 15, 35; 307/309

[56] References Cited

U.S. PATENT DOCUMENTS

| | | |
|---|---|---|
| 3,167,663 | 1/1965 | Melngailis et al. |
| 3,489,963 | 1/1970 | Gillett ............................ 357/27 |
| 3,599,323 | 8/1971 | Saxena ........................... 357/15 |
| 3,683,242 | 8/1972 | Hutson ........................... 357/35 |
| 3,700,979 | 10/1972 | Saxena ........................... 357/15 |
| 3,700,980 | 10/1972 | Belasco et al. ................. 357/35 |
| 3,831,186 | 8/1974 | Kroger ........................... 357/15 |

OTHER PUBLICATIONS

Physics of Semiconductor Devices by Size, pp. 265-270, 1981.
Electronics, May 19, 1982 by Roderic Beresford, "Magnetic Transistors Exploit New Theory of Carrier Modulation".
Journal of Applied Physics, vol. 28, #2, pp. 235-240, Feb. 1957, "Rectification Properties of Metal-Si Contacts", by Wurst et al.
Solid State Electronic Devices, 2nd Edition, Prentice-Hall, Inc., pp. 188-189.
IEEE Transactions on Electron Devices, vol. ED-28, No. 3, 3-1981, pp. 237-242.
Electronics International, vol. 55, No. 10, pp. 45-46.

*Primary Examiner*—Andrew J. James
*Assistant Examiner*—Mark Prenty
*Attorney, Agent, or Firm*—Edward H. Duffield

[57] ABSTRACT

Metal junction contact diode and transistor configurations that exhibit high magnetic sensitivity are described. Implanted emitters that have a perimeter area giving rise to unwanted components of minority carrier injection are eliminated in the junction which is limited to a uniplanar contact. Metal semiconductor junctions formed on P-type silicon have been discovered to be superior injectors for minority carriers when hafnium, zirconium, or zinc metal are used to form a silicide layer that forms a reliable emitter. Extreme high frequency capability linear response exist for these devices. They are operative between 0 hertz and 10 gigahertz.

6 Claims, 9 Drawing Figures

MAGNETICALLY SENSITIVE METAL SEMICONDUCTOR DEVICES

This is a continuation of co-pending application Ser. No. 499,101 filed on May 27, 1983 and now abandoned.

BACKGROUND OF THE INVENTION

This application is related to and is a continuation-inpart of my previous work described in copending applications Ser. Nos. 253,128, filed 4-13-81 and now abaondoned, Ser. No. 499,100, now abandoned, and Ser. No. 388,773 now abandoned.

FIELD OF THE INVENTION

This invention relates to magnetic transducers and sensors in general and in particular to semiconductive magnetically sensitive devices.

PRIOR ART

A variety of known and some new but related prior work of my own exists in this field. However, there are no presently known devices or teachings describing the use of metallic junction technology in magnetic transducers. This is believed to have occurred because injecting metal junctions are normally formed on N-type silicon. In that case, the metal work function is greater than that of silicon and the metal-semiconductor junction will be a Schottky barrier that will conduct majority carrier electrons. As has been pointed out in my prior work, the concept of Lorentz modulation of emitter injection requires the injection of minority carriers instead of majority carriers.

As noted in my aforementioned related patent application, the concepts of Lorentz modulation of emitter injection are new in the art. The desirability of limiting injection to a single plane or surface has been addressed in some of my prior work. In order to achieve higher frequency capabilities, it is necessary to place the emitter in close proximity to the collectors or a cathode in close proximity to the anodes. This has an adverse effect on signal to noise ratio and sensitivity. The effect is produced by the unwanted injection around the perimeter of implanted emitters or cathodes. I have previously solved this problem with barrier diffusions or implantations and with isolated surface emitters that are physically or mechanically trenched about their perimeter. However, it has been desired to achieve the necessary uniplanar emitter surface without the necessity of the somewhat more complex teachings.

OBJECTS OF THE INVENTION

An object of this invention is to provide an improved magnetically sensitive semiconductor device having uniplanar minority carrier injection at an emitter or cathode.

Yet another object of this invention is to provide an improved semiconductive magnetically sensitive device having high frequency operating characteristics.

SUMMARY

The foregoing and other objects unenumerated are met in the present invention by providing for the first time a metal-semiconductor junction as an emitter or cathode for a magnetically sensitive semiconductive transistor or diode, respectively. The metallic junction is preferably constructed using hafnium, zirconium, zinc, or any similar material that can form a silicide layer at the surface of P-type silicon substrates and having a work function potential $\phi_n$ less than 4.8 volts. Because no unwanted perimeter injection exists from the Schottky barrier, i.e., it is a uniplanar, unidirectional injection source, it is not necessary to remove the collectors or anodes to a distance more widely separated from the source of minority carriers in order to emphasize the contribution of those carriers injected in the desired direction. Instead, since the carriers may all be injected in the desired vertical direction for maximum sensitivity to magnetic flux directed parallel to the surface of the substrate, the collectors or anodes can be brought very close to the emissive surface. This, in turn, leads to a high frequency capabililty due to the short carrier transit times. Both vertical and lateral diode and transistor structures are possible and have been constructed as shown herein.

DETAILED SPECIFICATION

The teachings of Schottky barrier transistors either do not exist or have not been uncovered in my research in the literature available today. The fact that metallic junction injecting sources can be constructed is obscure, but a known reference is by E. C. Wurst, Jr. and E. C. Borneman appearing in the Journal of Applied Physics, Vol. 28, No. 2, Pgs. 235–240, Feburary 1957. This work describes the rectifying capabilities of various metals in contact with both P and N-type silicon. The capability of minority carrier injection from a metallic junction, while not disclosed in this reference, is clearly supported by the findings of conduction and injection from various metal contacts with the noted substrates in this work.

I have discovered that by proper choice of contact metal, and the use of P-type silicon substrates, strongly injecting metallic contact junctions can be formed which serve admirably for the purpose of uniplanar injection sources for magnetically sensitive devices as described herein.

The metals hafnium, zirconium, and zinc form appropriate silicides with silicon substrates when a heat treatment is carried out. The heat treatment is generally known in the art and will not be described in detail herein. Briefly, it consists in heating the substrate on whose surface has been deposited the appropriate metal in the desired areas to a temperature approximating 1000° F. until a metallic silicide is formed at the junction between the two materials.

The junction potential ($\phi_s - \phi_m$) for Hafnium silicide that provides a reliable injection junction is approximately a negative 0.95 volts at room temperature. Zirconium and zinc also have a junction potential of approximately negative 0.8 volts and negative 0.53 volts respectively at room temperature. The other elements also form suitable junctions but are less desirable insofar as they are presently understood.

Base or anode ohmic output contacts can be made using ordinary aluminum for example, but junction contacts of the desired metal can also be used. It is only necessary that a good ohmic base contact or anode contact be made. This can be achieved by heavily doping a P-region in the substrate in the area in which the aluminum is to make ohmic contacts for the collector or anode outputs.

Figure 1:
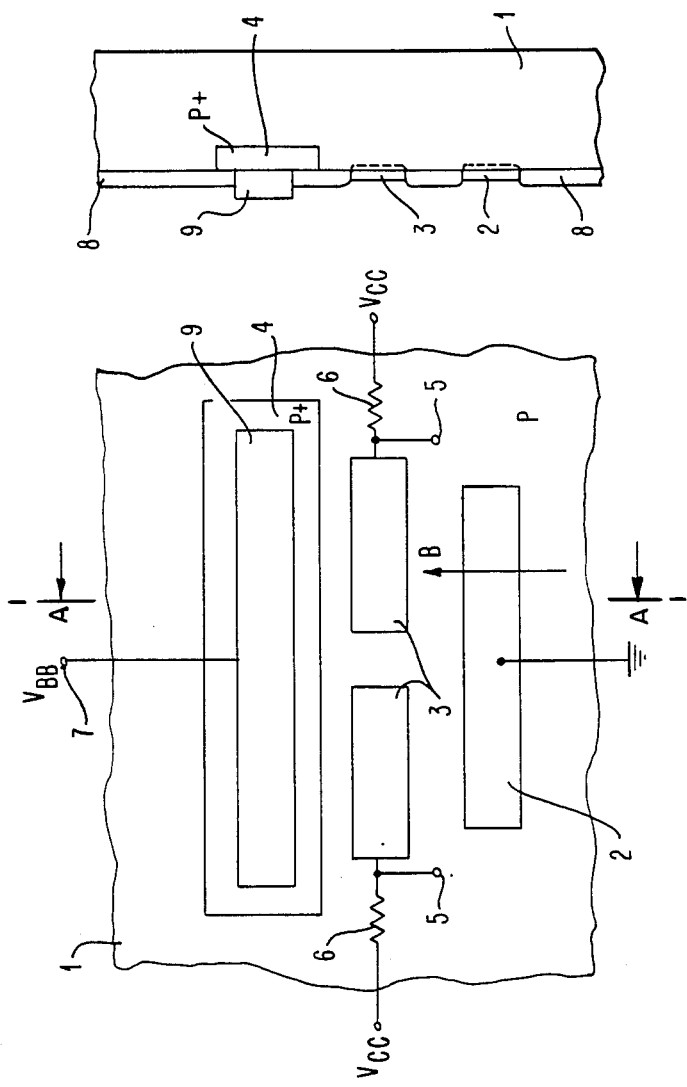
FIG. 1A illustrates a plan view of a typical magnetically sensitive metallic junction lateral transistor constructed in accordance with the teachings of this application as a preferred embodiment of the invention.
FIG. 1B illustrates a sectional elevation view of the structure shown in FIG. 1A.

Turning to FIG. 1, a preferred form of a metallic junction magnetically sensitive transistor is illustrated in FIGS. 1A and 1B. In FIG. 1A, a plan view with the overlying oxide coating of the semiconductive substrate removed for clarity is shown. Semiconductive substrate 1 is supplied with a metallic rectifying emitter contact 2. Preferably hafnium metal is used and a heat treatment as mentioned above is performed to create a hafnium silicide layer at the junction between the substrate 1 and the emitter metal 2. Two hafnium metal collectors with similar silicide barrier layers are deposited as collectors 3. The collectors are spaced on either side of an imaginary plane constructed perpendicular to the emissive surface and passing through the Lorentz potential null of the emitter area. This concept, which utilizes the effect of the induced Lorentz potential that occurs when carriers intercept a magnetic field is described in my previous applications and in papers appearing in the IEEE Electron Device Letters, Vol. 3, No. 8, August 1982 and in the IEDM Transactions, December 1982. For purposes of this description, it suffices to say that the Lorentz potential which is induced modulates emitter injection or cathode injection. This will be briefly described as follows.

In FIG. 1A, the hafnium emitter junction is forward biased by applying a positive voltage to the base contact 9 while grounding the emitter 2. Base contact 9 can be ordinary aluminum making only ohmic contact with the surface of the semiconductive substrate 1. P-type substrates make good ohmic contact with aluminum and to achieve even better contact, a heavy doping P+ material in the vicinity of the base contact may be carried out. This is illustrated as the implanted area 4 with the actual aluminum contact shown as 9 in FIGS. 1A and 1B. Under the circumstances described, a quiescent current will be caused to flow in the collector circuit comprising the load resistors 6. This can be sensed at the output terminals 5. This current can be controlled by the base voltage applied to the base at terminal 7 in a well known manner. The quiescent collector current of the reversed biased collector is essentially balanced at the outset, but may be imbalanced by applying a magnetic field vector parallel to the surface of the emitter.

Preferably, the emitter injects all minority carriers in the same direction, in this case, directly into the substrate in a vertical manner. Thus, these carriers will intercept the magnetic flux vector at right angles and produce the maximum Lorentz potential along the bottom single plane of the emitter junction. The application of a magnetic field parallel to this plane modulates the forward bias voltage occurring at the emitter junction since the Lorentz potential is greater at one side of the emitter than at the other and increases injection toward the one side while suppressing it toward the other. A null point exists between the two extremes of the Lorentz voltage. In the example shown in FIG. 1A, the effect is such that the of the left half of the emitter junction will inject more electrons than the right half. In P-type silicon substrates, electrons are the minority carriers as required for operation.

The emitted minority carriers stream toward the two spaced apart collectors 3 and are drawn off through the load resistors 6. This results in a differential collector current which can be sensed as a differential voltage between the output terminals 5. This occurs as a result of the left collector receiving an increase in minority carrier flow while the right collector experiences a decrease in minority carrier flow. The total emitter current remains unchanged.

The structure in FIG. 1A is further described with reference to the sectional elevational view along line AA which is depicted in FIG. 1B.

In FIG. 1B, the P-type silicon substrate 1 is provided with a general overall silicon dioxide insulator coating 8 which was removed for clarity in FIG. 1A. Windows are opened up through etching, after an appropriate m ask step, to provide areas for deposition of hafnium emitter metal 2, collector metal 3, the implantation of the P+ base contact area 4 and the application of the aluminum base contact 9. A heating process as previously alluded to is then carried out which creates the metal silicide barrier junction for injecting and collecting operation of the emitter and collectors. P-type silicon preferably with a resistivity greater than 2 ohm centimeters is employed. A metal junction - P silicon - metal junction transistor configuration is thus described. The magnetically sensitive transistor has a distinct advantage over NPN junction transistors described in my previous papers and patent applications. The metal junction transistor is simple to fabricate and is completely free of unwanted lateral minority carrier injection that normally will occur around the perimeter of a diffused or implanted emitter or cathode.

As has been described in my previous work, perimeter injection in undesirable since this leads to a reduction in sensitivity for the desired magnetic field components and will account for a magnetic sensitivity to field components directed other than in the desired direction. If fields other than that preferred are employed, sensitivity to flux in unwanted directions cannot be distinguished at the output from that which is desired.

If it is desired to use the metal junction transistor as a sensor in mass disc storage systems, for example, the sensor height and length will be typically 1.0 and 4.0 micrometers, respectively. The mounted and packaged sensor must also be brought close to the magnetically recorded medium. Consequently, a grinding and lapping process will ordinarily be carried out that may come close to an edge of the emitter part and actually lap away a portion of it. Unlike a PN junction emitter, the metal junction is essentially unaffected by a removal of a small portion along its edge.

Magnetically sensitive diodes and transistors depend on minority carrier injection. The injected minority carriers reduce conductivity in the region between the emitter or cathode and the output base, collector or anodes. A high level injection of minority carriers with base resistivities in excess of 2 ohm centimeters can satisfy the desired criteria.

Figure 3:
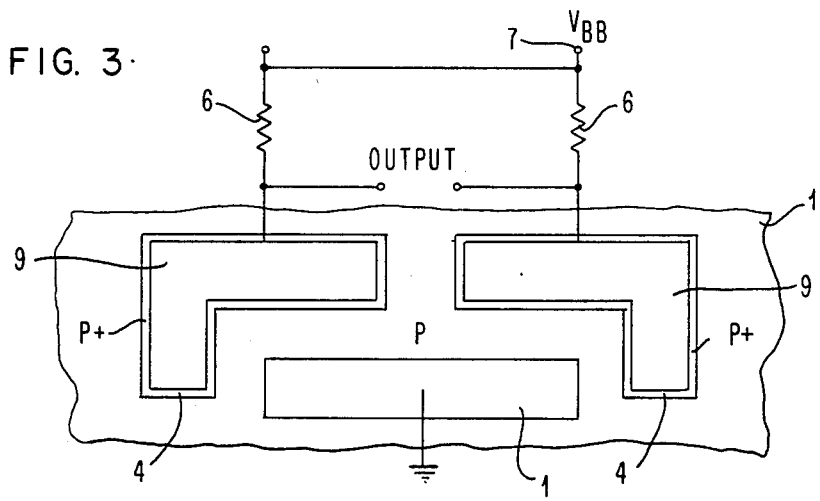
FIG. 3 illustrates a plan view of a preferred form of a magnetically sensitive metallic contact diode constructed as a preferred embodiment of the invention herein.

FIG. 3 illustrates a magnetically sensitive metal junction diode formed using hafnium, zirconium or zinc metal contacts as the cathode in contact with a P-type silicon substrate. The magnetic field is, as in the previous FIG. 1, oriented parallel to the surface of the junction such that modulation of injection across the junction will take place when the magnetic field is present. The preferential injection of minority carriers from the emissive surface of the emitter or cathode will result in modulation of the base conductivity that will lead to differential voltage measured at the base contacts. The expression defining the differential current that will flow in the diode shown in FIG. 3 is given below as equation (1).

$$\Delta I = \frac{\Delta V_j}{R_L + R_{bo} + \Delta R_{bo}} \left\{ \frac{I_o R_{bo} L_n}{KT/q\, L_{eb}} \left[ \frac{1}{1 + \frac{N_A}{N'(O)} \frac{\mu_p}{\mu_p + \mu_n}} - \frac{1}{1 + \frac{N_A}{N'(O)} \frac{\mu_p}{\mu_n + \mu_p} e^{L_{eb}/L_n}} \right] \right\} \quad \text{Eq. (1)}$$

Figure 2:
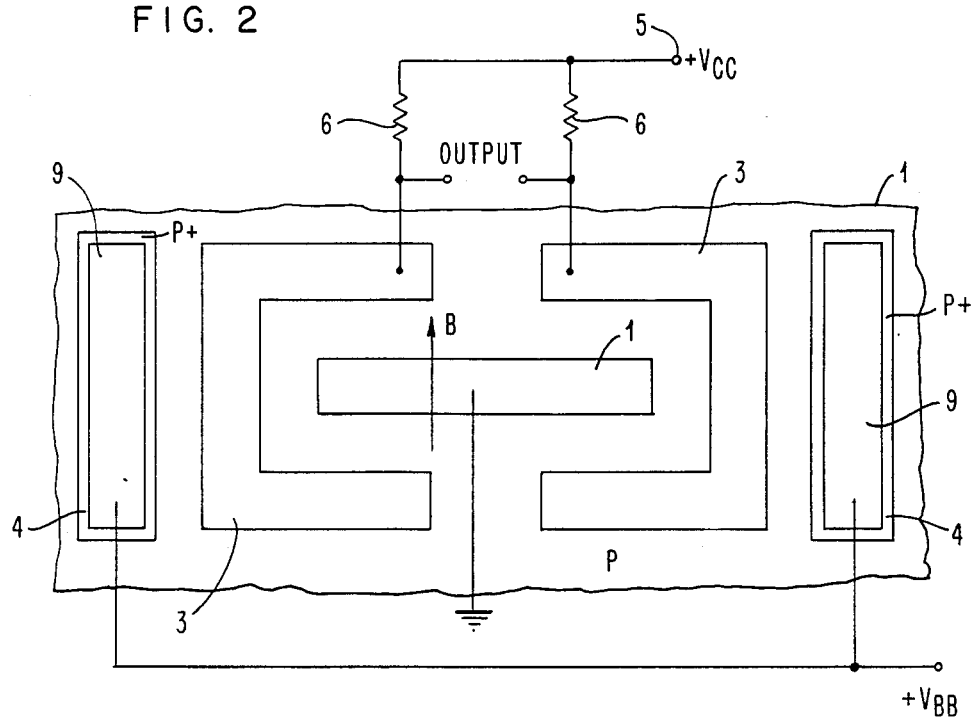
FIG. 2 illustrates a plan view of another preferred embodiment of a lateral transistor constructed in accordance with the teachings of this application as a preferred embodiment thereof.

Where:
ΔVj=Lorentz voltage modulation at junction
Rbo=Quiescent base resistance
Io=Quiescent forward bias current
Ln=Minority carrier electron diffusion length
N'(O)=Excess minority carrier concentration injected at junction
Leb=Distance between emitter and base contact
$\mu_p$=Hole mobility
$\mu_n$=Electron mobility
RL=Load resistance Turning to FIG. 2, a different magnetically sensitive lateral metal junction transistor configuration is shown in plan view. In FIG. 2, the collectors 3 are relatively C-shaped and surround the ends of the metal emitter 2. However, the collectors 3 still reside on opposite sides of an imaginary plane passing through the Lorentz voltage null and perpendicular to the emissive surface as required for proper opreation. The other elements are similarly numbered for the same purpose and function as that described with reference to FIGS. 1A and 1B.

Placing the ohmic base contacts 9 at a symmetrically spaced distance relative to the emitter and the collectors results in attracting the minority carriers toward the direction of each collector to maximize collection of injected carriers. This enhances the overall sensitivity of the device. A signal output will be measured between the collector metal junctions 3 which also employ hafnium metal in the preferred embodiment as shown. The magnetic field vector B is shown in FIG. 2 as parallel to the bottom surface of the emitter so that the maxiumum Lorentz potential modulation of the emitter injection will occur as described in my aforementioned references.

Turning to FIG. 4, a vertically oriented structure of the preferred form of this invention will be described. In all of the structures described thus far and in those which will be described with reference to FIG. 4, it is necessary to realize that the collector contacts need not be metal junction elements. Indeed, hybrid transistors and diodes where the emitters or cathodes, for example, use a metal junction can be built with collectors or anodes having normal diffused junctions with aluminum metal contacts or the like.

Figure 4C:
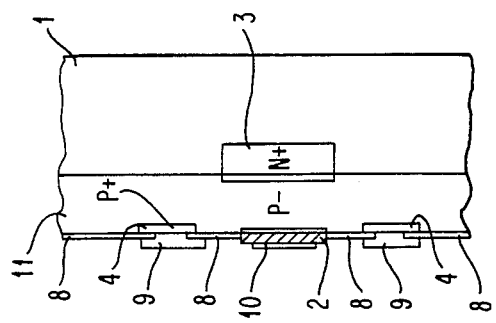
FIG. 4C illustrates another sectional elevation view of the structure shown in FIG. 4A.
Figure 4A:
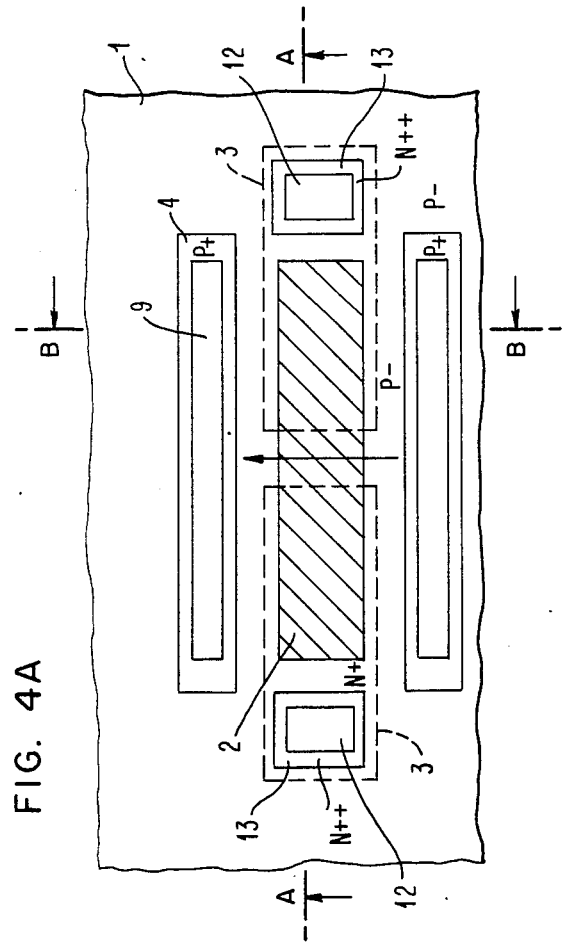
FIG. 4A illustrates a plan view of a vertically structured magnetically sensitive transistor as a preferred embodiment of the invention herein.
Figure 4B:
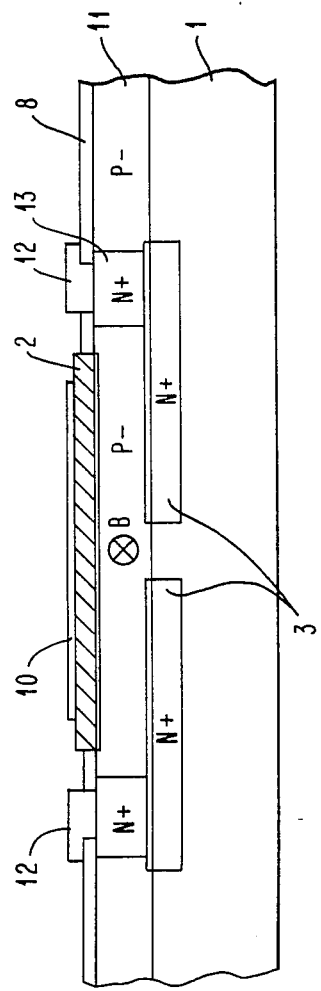
FIG. 4B illustrates a sectional elevation view of the structure shown in FIG. 4A.

Turning to FIGS. 4A-4C, a vertical metal junction injection magnetically sensitive transistor is shown. In FIG. 4A, a plan view of the elements in their arrangement on a semiconductive substrate 1 is shown. The emitter 2 is positioned on a top surface and directly above the two spaced apart collectors 3. Collector contacts 12 contact N+ doped regions which are diffused deeply to makes contact with the N+ doped collectors located beneath the emitter. The metallic base contact 9 makes contact with P+ doped regions since aluminum makes good ohmic contact with P+ material. N+ material also allows for good ohmic contact but this material is avoided here to prevent the creation of rectifying contacts at these points.

FIG. 4B shows a horizontal sectional elevation view along line AA in FIG. 4A. It will be observed that the emitter 2 is provided with an aluminum top ohmic contact 10. The oxide layer 8 is shown in FIG. 4B with windows opened up for the aluminum contact 12 and the emitter 2. This structure is built in a somewhat different fashion. First, a semiconductor substrate 1, which may be either P or intrinsic material for these purposes and is not an active part of the structure, is implanted with the collector regions 3. These are heavily N+ doped with arsenic, for example. These regions lie in the top eiptaxial layer 11 of P− semiconductor material is laid down over the entire semiconductive substrate 1 and the collectors 3. Next, a heavy doping of phosphorous for example, which can be implanted or diffused to relatively great depths, is provided in region 13 to make contact with the N+ doped collectors from the top surface of the P− epitaxial layer. Next, the oxide layer 8 will be grown or deposited and then an etching step is carried out to open up the contact windows for the aluminum contacts 12 for the collectors, 9 for the base contacts and in the region for the emitter 2. The metal depositions for the metal junction and for the contacts are then made.

FIG. 4C illustrates another sectional view BB through an end elevation of the structure shown in FIG. 4A. It may be observed that the collectors 3 are directly beneath the emitter 2 and are separated by the relatively thin P− layer 11. This means that the emissive surface of the emitter 2 is directly aligned with the collector surfaces 3. Lorentz modulation of emitter injection occurs at the emitter 2 and will supply current more heavily to one collector 3 than the other depending on the direction of a magnetic flux vector. The most sensitive direction for interaction is when the magnetic flux vector passes parallel to the substrate and the emissive surface so as to be perpendicular to the direction of travel of the injected minority carriers.

These structures exhibit the highest frequency response that extends well into the gigahertz range. In addition, they are extremely linear and have a high signal to noise ratio with little or no unwanted components due to injection from other than the desired uniplanar injection surface.

The metal junction technology also provides an opportunity for creating magnetically sensitive diodes and transistors without diffusions or implantations into the substrate.

Figure 5:
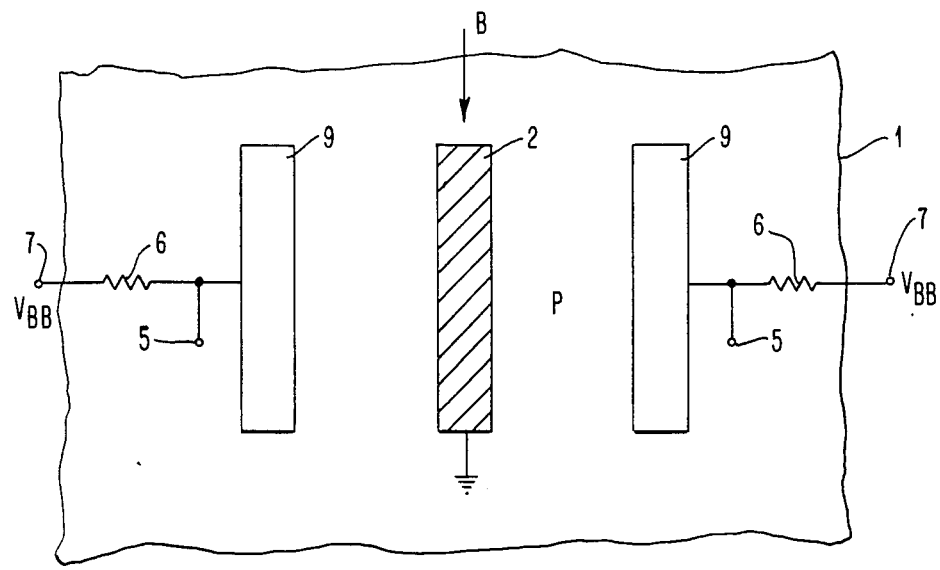
FIG. 5 illustrates a plan view of a magnetically sensitive Schottky barrier lateral diode as a preferred embodiment of the invention.

For example, FIG. 5 illustrates a plan view of a preferred form of a metal junction diode that is magnetically sensitive. The substrate 1 and the emitter or cathode 2 are constructed as explained above. The cathode 2 is rectifying contact junction. The base or anode contacts are ohmic contacts 9. It may be observed that the base and emitter are all in the same plane, do not require diffusions or implantations and are easily constructed. The magnetic vector B is also shown in FIG. 5. It is directed parallel with the substrate 1 and the emissive surface of the cathode 2. It could be directed at right angles in the plane of the paper or at any other direction within the plane of the paper and still remain perpendicular to the vertically injected minority carriers issuing from the bottom surface of the emitter 2 downward into the substrate 1. The Lorentz potential will be developed at right angles to the magnetic vector and, in the case illustrated in FIG. 5, along the shorter axis of the emitter 2. The null point of the Lorentz potential will be on the center line or longitudinal axis of emitter 2 and it may be seen that the imaginary plane constructed perpendicular to the emissive surface and passing through the null of the Lorentz potential will also lie along this axis.

The base or anode contacts in the case of a diode and collector contacts and base contacts in the case of a transistor will be located as described above on opposite sides of this imaginary plane. By making the base or anode contacts uniplanar and coplanar with the emitter, several important attributes result. First, it is easy to vary the distance or spacing between the contacts and the emitter. For example, an experimental structure with numerous base contacts spaced at different distances from the emitter can be constructed and then the base contacts of greatest signal output can be utilized. There is an important dependence upon the distance between the base or anode contact and the emitter and it will be instantly appreciated that the farther the contacts are removed from the emitter, the more minority carriers will be subject to recombination in substrate 1. This will reduce the overall signal output. Secondly, it is much easier to make good ohmic contact and supply a high quality diode function than it is to make consistently controlled high quality diffusion contacts and still avoid the creation of rectifying junctions at the output contacts. This is a problem familiar to those acquainted with solid state semiconductor devices and needs no further description, the point being that exceptionally high quality diodes are manufactured in this manner with pure ohmic contact. Thirdly, by placing all the contacts and elements on one surface, it is possible to create a magnetically sensitive structure that can be brought to a very thin finished depth so that it may be put in service at close proximity to a magnetic medium with field vectors in the appropriate direction as shown by vector B in FIG. 5 for example.

Figure 6:
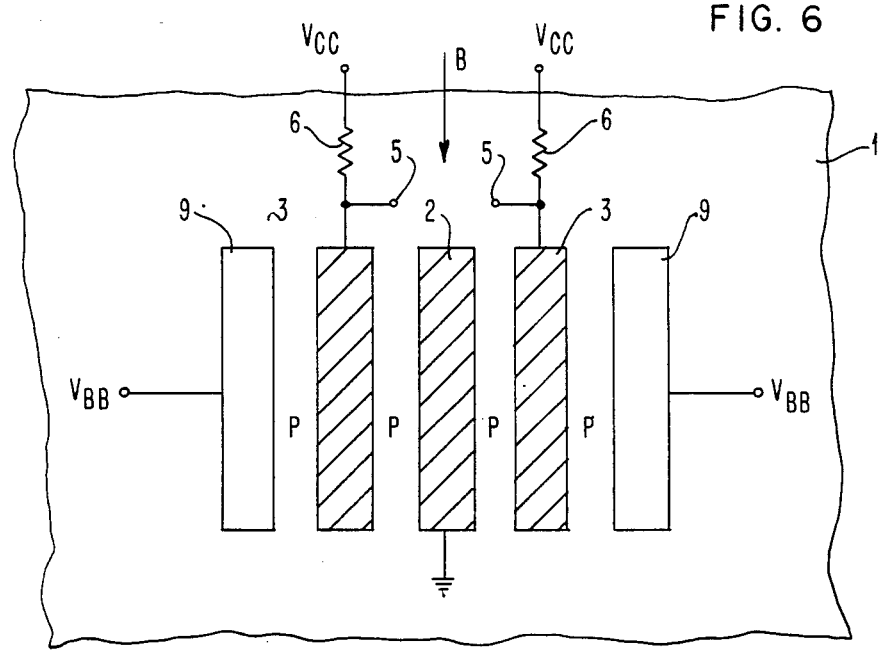
FIG. 6 illustrates a plan view of a preferred embodiment of a magnetically sensitive metallic junction lateral transistor according to the invention.

FIG. 6 illustrates in schematic plan view a magnetically sensitive transistor employing an emitter 2, two spaced apart rectifying collectors 3 and two ohmic base contacts 9. It will be observed that the structure is similar to that in FIG. 5 with the exception that rectifying collectors have been added between the base contacts and the emitter. The placement of the collector between the bases and the emitter and in the same plane as the emitter is important for the reasons noted with respect to the diode but also is easily constructed for the same reasons as well.

The collectors 3 in FIG. 6 are preferably the rectifying junction contacts similar to the emitter 2. However, doped diffusions or implantations can also be utilized in a hybrid form of this transistor. It will be observed that in FIG. 6 and FIG. 5 as well, the base or anode contacts and the collector contacts as well, when present, are located on opposite sides of said imaginary plane and parallel therewith with the collectors spaced closer to the emitter than are the base contacts. This placement of the elements relative to one another enhances the effect of the Lorentz modulation of emitter injection by encouraging the minority carrier flow to occur directly between the emitter and the collectors or anodes. This means that virtually all carriers which are emitted will take part in and add to the eventual differential output signal which equates to a high overall transduction efficiency.

It will be observed in FIG. 6 that the alignment of the various elements on a common axis, horizontal in the case of FIG. 6, provides straight line paths for all emitted carriers with no off-axis disturbances due to physical necessity of locating base contacts and other areas which are present in other structural implementations of this invention. As was alluded to in my aforementioned copending application, the position of the base contact relative to the emitter has an important effect on encouraging the desired direction of carrier injection and on limiting or reducing unwanted noise components. It has been found that the most desirable placement of the elements is parallel with said imaginary plane as shown in the FIGS. 5 and 6 and most desirably in the same plane as depicted in these figures. However, vertically integrated structures described earlier still maintain the parallelism and achieve the highest frequency response and transduction efficiencies for the reasons discussed relative thereto.

Relative to both FIGS. 5 and 6, it will be observed that the orientation of the emitter surface relative to the magnetic flux vector B is such that the device will be most sensitive to flux components directed along a vertical Y axis in the plane of the paper. Lorentz modulation of emitter injection will be most pronounced along the edges or long axes of the emitters 2 in these figures. It is possible given these considerations, to envision an array of such sensors on a single substrate with the array oriented at precise angles for the purpose of analyzing a magnetic flux field as to direction in density and the like. A digital magnetic compass can thus be rather easily constructed from a plurality of such sensors on a single substrate for example. As will be evident to those of skill in the art, numerous configurations are possible and this, combined with the ease of varying the position of the base contacts relative to the collectors and the emitter and to the ease of constructing such uniplanar devices as alluded to above, will readily suggest numerous variations and configurations depending upon the specific application to which the sensor is directed.

Having thus described my invention with reference to several preferred embodiments thereof, it will be obvious to those of skill in the art that numerous changes in structure, manufacturing procedure, doping elements, thickness, dimensions, orientation and arrangement of the elements and the like may be per- formed without departing from the basic scope and teachings of the invention. Therefore, the claims which follow are intended by way of description rather than limitation of the invention sought to be claimed.

Having thus described my invention, what I desire to protect by Letters Patent is:

1. A magnetically sensitive metal semiconductor junction device, comprising:
   a uniplanar metal emitter junction on a semiconductive substrate;
   said emitter being supplied with electrical potential forward biasing said metal semiconductor junction into substantially uniplanar and unidirectional injection of minority carriers into said substrate;
   said junction having a finite area of contact with said substrate, said area having at least one dimension thereof lying perpendicular to the direction of magnetic fields to be sensed and perpendicular to the direction of injection of said minority carriers;
   at least one output contact on said substrate, at least half of said output contact being on one side of an imaginary plane constructed perpendicular to the surface of said emitter and passing through and bisecting said one dimension of said junction, said output having electrical potential supply connections to provide an electrical output signal in response to magnetic fields intercepting the substrate parallel to the surface of said emitter.

2. A magnetically sensitive device as described in claim 1, further comprising:
   at least two said output contacts located on opposite sides of said imaginary plane.

3. A magnetically sensitive device as described in claim 1 and further including:
   said substrate comprising a base of semiconductive material, and;
   at least one ohmic base contact supplied with electrical potential and forward biasing said emitter junction.

4. A magnetically sensitive device as described in claim 2 and further including:
   said substrate comprising a base of semiconductive material, and;
   at least one ohmic base contact supplied with electrical potential and forward biasing said emitter junction.

5. A magnetically sensitive device as described in claim 1 or claim 2 or claim 3 or claim 4 wherein:
   said metal-semiconductor junctions are formed with hafnium, zirconium or zinc metal on a silicon P-type semiconductive substrate.

6. A magnetically sensitive device as described in claim 1 or 2 or 3 or 4, wherein:
   said output contacts comprise rectifying junctions;
   said rectifying junctions being supplied with electrical potential reverse biasing them relative to said substrate.

* * * * *